United States Patent
Izuha et al.

(10) Patent No.: US 10,163,776 B2
(45) Date of Patent: Dec. 25, 2018

(54) DESIGNING METHOD OF CAPACITIVE ELEMENT IN MULTILAYER WIRINGS FOR INTEGRATED CIRCUIT DEVICES BASED ON STATISTICAL PROCESS

(75) Inventors: Kyoko Izuha, Kanagawa (JP); Hiroaki Ammo, Kanagawa (JP); Yoshiyuki Enomoto, Kumamoto (JP)

(73) Assignee: Sony Corporation, Tokyo (JP)

( * ) Notice: Subject to any disclaimer, the term of this patent is extended or adjusted under 35 U.S.C. 154(b) by 556 days.

(21) Appl. No.: 12/654,803

(22) Filed: Jan. 5, 2010

(65) Prior Publication Data

US 2010/0207242 A1    Aug. 19, 2010

(30) Foreign Application Priority Data

Feb. 16, 2009    (JP) ................. 2009-032245

(51) Int. Cl.
  *H01L 23/522*    (2006.01)
  *H01L 27/02*    (2006.01)
  *H01L 49/02*    (2006.01)

(52) U.S. Cl.
  CPC ...... *H01L 23/5223* (2013.01); *H01L 23/5222* (2013.01); *H01L 27/0207* (2013.01); *H01L 28/40* (2013.01); *H01L 2924/0002* (2013.01)

(58) Field of Classification Search
  CPC ................. H01L 23/5222; H01L 23/5223
  USPC ........................................... 257/532
  See application file for complete search history.

(56) References Cited

U.S. PATENT DOCUMENTS

| 5,583,359 | A | 12/1996 | Ng et al. | |
|---|---|---|---|---|
| 7,276,776 | B2 * | 10/2007 | Okuda et al. | 257/532 |
| 7,893,536 | B2 * | 2/2011 | Takada | H01L 23/5222 257/758 |
| 8,330,251 | B2 * | 12/2012 | Chang | H01L 23/5223 257/307 |

FOREIGN PATENT DOCUMENTS

JP    3851898    9/2006

* cited by examiner

*Primary Examiner* — Laura Menz
*Assistant Examiner* — Candice Y Chan
(74) *Attorney, Agent, or Firm* — Chip Law Group

(57) ABSTRACT

Disclosed herein is a capacitive element formed by multilayer wirings, wherein a total capacitance, intralayer capacitance and interlayer capacitance are calculated for a plurality of device structures by changing parameters relating to the multilayer wirings in an integrated circuit, a device structure is identified, from among the plurality of device structures, whose difference in the total capacitance between the device structures is equal to or less than a predetermined level and at least either of whose ratio of the intralayer capacitance to the total capacitance or ratio of the interlayer capacitance to the total capacitance satisfies a predetermined condition, and the parameters of the device structure satisfying the predetermined condition are determined as the parameters of the multilayer wirings.

17 Claims, 8 Drawing Sheets

| STRUCTURE | ANGLE OF THE UNIT CIRCLE | WIRING WIDTH | WIRING FILM THICKNESS |
|---|---|---|---|
| A | 0 | 1.150 | 1.000 |
| B | 30 | 1.130 | 1.059 |
| C | 45 | 1.106 | 1.083 |
| D | 60 | 1.075 | 1.102 |
| E | 90 | 1.000 | 1.118 |
| F | 120 | 0.925 | 1.102 |
| G | 135 | 0.894 | 1.083 |
| H | 150 | 0.870 | 1.059 |
| I | 180 | 0.850 | 1.000 |
| J | 210 | 0.870 | 0.941 |
| K | 225 | 0.894 | 0.917 |
| L | 240 | 0.925 | 0.898 |
| M | 270 | 1.000 | 0.882 |
| N | 300 | 1.075 | 0.898 |
| O | 315 | 1.106 | 0.917 |
| P | 330 | 1.130 | 0.941 |
| Q | 360 | 1.150 | 1.000 |

|            | A        | B        | C        | D        |
|------------|----------|----------|----------|----------|
| total      | 1.121939 | 1.147937 | 1.147685 | 1.128132 |
| inter      | 0.418682 | 0.436453 | 0.443769 | 0.450535 |
| intra      | 0.703256 | 0.711484 | 0.703915 | 0.677597 |
| inter/total| 0.373177 | 0.380206 | 0.386665 | 0.399364 |
| intra/total| 0.626823 | 0.619794 | 0.613335 | 0.600636 |

|  | A | B | C | D |
|---|---|---|---|---|
| total | 1.121939 | 1.147937 | 1.147685 | 1.128132 |
| inter | 0.418682 | 0.436453 | 0.443769 | 0.450535 |
| intra | 0.703256 | 0.711484 | 0.703915 | 0.677597 |
| ΔDi/Si | 0.220588 | 0.071693 | -0.00989 | -0.0859 |
| D | 1.000 | 1.059 | 1.083 | 1.102 |
| W | 1.150 | 1.130 | 1.106 | 1.075 |

FIG. 10B

|  | A | B | C | D |
|---|---|---|---|---|
| total | 0.903435 | 0.881302 | 0.879572 | 0.889234 |
| inter | 0.210296 | 0.196193 | 0.191405 | 0.189397 |
| intra | 0.500628 | 0.492261 | 0.494868 | 0.504787 |
| ΔDi/Si | -0.16304 | -0.05521 | 0.007991 | 0.073912 |
| D | 1.000 | 0.941 | 0.917 | 0.898 |
| W | 1.150 | 1.130 | 1.106 | 1.075 |

DESIGNING METHOD OF CAPACITIVE ELEMENT IN MULTILAYER WIRINGS FOR INTEGRATED CIRCUIT DEVICES BASED ON STATISTICAL PROCESS

BACKGROUND OF THE INVENTION

1. Field of the Invention

The present invention relates to a capacitive element, designing method of the same and integrated circuit device including the same, and more particularly to a capacitive element formed by multilayer wirings in an integrated circuit, designing method of the same and integrated circuit device including the same.

2. Description of the Related Art

Recent years have witnessed a remarkable progress in the semiconductor manufacturing techniques, mass-producing semiconductors with a minimum feature size of 0.1 µm or less. With the miniaturization of devices, process variations which were not problematic in the previous generation have led to unintended performance of the manufactured devices.

Of all circuit characteristics, the capacitance variation of the capacitive element affects the performance of analog devices the most significantly. Therefore, the capacitance variation of the analog elements is the most essential factor in terms of performance and therefore rigorously managed. Among examples of analog devices is a capacitance-type DA (digital to analog) converter.

Figure 15:
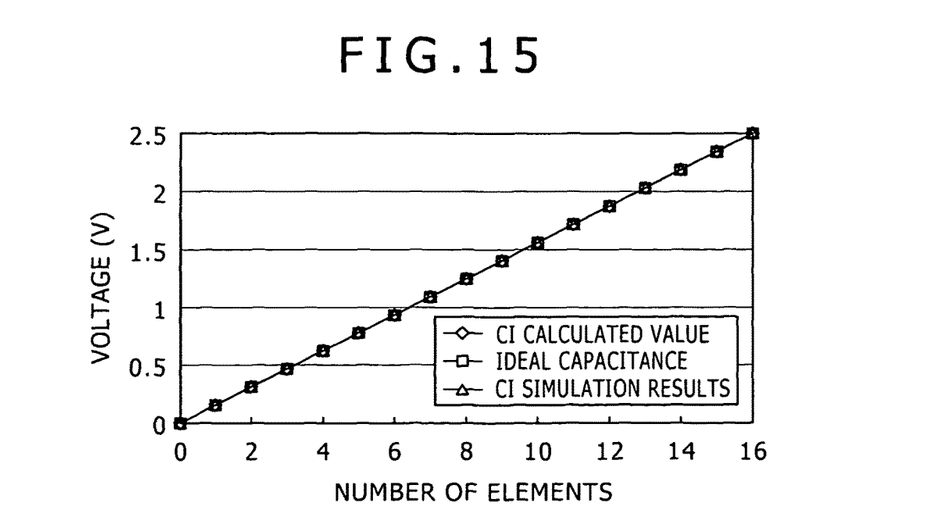
FIG. 15 is a diagram illustrating an example of characteristic of a DA converter (relationship between the number of capacitive elements and the output voltage level)

A capacitance-type DA converter includes a plurality of capacitive elements connected in parallel. Such capacitive elements should preferably have a completely linear relationship between the number of capacitive elements and obtained characteristics (e.g., current and voltage levels) as illustrated in FIG. 15. Practically, however, there are variations between the capacitive elements, possibly resulting in unintended performance due to a non-linear relationship. Therefore, it is common to use capacitive elements with a large area in order to reduce element-to-element variations.

Figure 16:
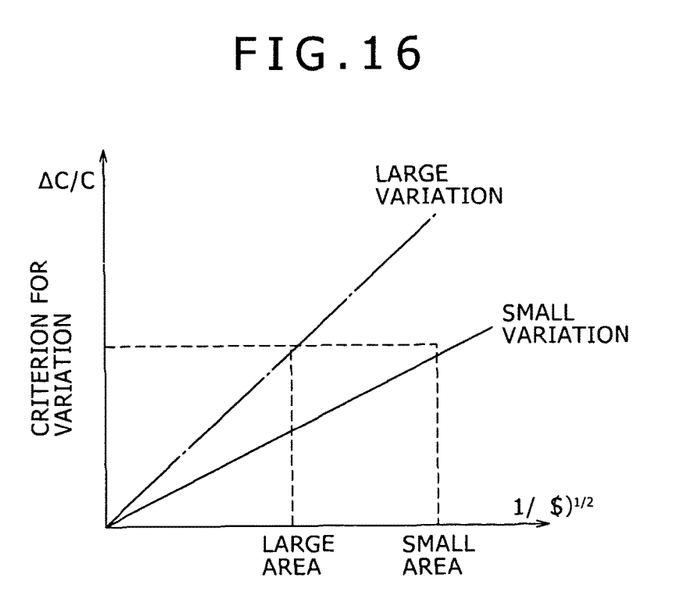
FIG. 16 is a diagram illustrating the relationship between a chip area and capacitance variation.

However, using elements with a large area leads to increased chip area as a whole and increased power consumption. That is, increase in chip area and achievement of intended performance (reduced capacitance variations) are in a tradeoff relationship. The graph in FIG. 16 is a Peligrom plot showing the area of the capacitive elements $(1/(area)^{1/2})$ along the horizontal axis and the capacitance variations along the vertical axis.

When the variation threshold (dashed line parallel to the x axis) is fixed in this graph, the smaller the variation between the elements (solid line), the smaller the area. This makes it possible to reduce the chip area and power consumption. In order to intentionally suppress the variations between the elements, however, there has been hitherto no other alternative but to suppress the process variations by increasing, for example, the wiring width of the elements themselves knowing that doing so will result in increased area.

An existing technique known to solve these problems is a device structure having a one-to-one relationship between a width W of wirings forming the capacitive elements and a wiring-to-wiring spacing S (refer, for example, Japanese Patent No. 3851898 and U.S. Pat. No. 5,583,359, hereinafter referred to as Patent Documents 1 and 2). The device structure having a one-to-one relationship between the wiring width W and spacing S will be hereinafter referred to as the close-packed structure. The close-packed structure has been chosen because an element having this structure offers the smallest area.

SUMMARY OF THE INVENTION

However, although providing the smallest capacitive element area, the close-packed structure according to the existing example is susceptible to variations (manufacturing variations) from the viewpoint of process, thus resulting in capacitance variations between the capacitive elements.

In light of the above, it is desirable to provide a capacitive element with a smaller capacitance variation than the close-packed structure, designing method of the same and integrated circuit device including the same.

In order to achieve the above desire, the present embodiment manufactures a capacitive element formed by multilayer wirings in an integrated circuit, by the following designing method. That is, a total capacitance, intralayer capacitance and interlayer capacitance are calculated first for a plurality of device structures by changing parameters of the plurality of device structures relating to the multilayer wirings by a statistical process. Next, a device structure is identified, from among the plurality of device structures, whose difference in the total capacitance between the device structures is equal to or less than a predetermined level and at least either of whose ratio of the intralayer capacitance to the total capacitance or ratio of the interlayer capacitance to the total capacitance satisfies a predetermined condition. Finally, the parameters of the device structure satisfying the predetermined condition are determined as the parameters of the multilayer wirings forming the capacitive element.

In the plurality of device structures whose wiring-related parameters have been changed by a statistical process, the fact that the difference in the total capacitance between the device structures is equal to or less than a predetermined level in the region where the difference in the total capacitance between the device structures is equal to or less than a predetermined level means that the total capacitance remains stable with only a small change. Therefore, a device structure is identified, from among the plurality of device structures, which satisfies the above condition. The parameters of the device structure satisfying the above condition are determined as the parameters of all of the multilayer wirings forming the capacitive elements. This provides a capacitive element having a device structure robust to process variations.

Embodiments of the present invention provides a device structure with a smaller capacitance variation than that (close-packed structure) having a one-to-one relationship between the width of wirings forming the capacitive elements formed by multilayer wirings in an integrated circuit and the wiring-to-wiring spacing.

DETAILED DESCRIPTION OF THE PREFERRED EMBODIMENTS

A detailed description will be given below of modes for carrying out the present invention (hereinafter written as embodiments) with reference to the accompanying drawings. It should be noted that the description will be given in the following order:
1. Capacitive element to which the present embodiment is applied
2. First embodiment (example in which the wiring width W and wiring height T are used as parameters)
3. Second embodiment (example in which the wiring-to-wiring spacing S and interlayer film thickness D are used as parameters)
4. Third embodiment (example in which the threshold setting is changed from those of the first and second embodiments)
5. Fourth embodiment (example in which the threshold setting range is changed from that of the third embodiment)
6. Application example (example in which a circuit device contains a DA converter)

<1. Capacitive Element to Which the Present Embodiment Is Applied>

First, the capacitive element to which the present embodiment is applied will be described. The capacitive element to which the present embodiment is applied is formed by multilayer wirings. In a multilayer wiring structure of an integrated circuit, a capacitance is formed between two wirings vertically, horizontally or, in some cases, diagonally adjacent to each other in the presence of a potential difference therebetween. The theory behind this is the same as for electrostatic capacitance of a plate capacitor which will be described later. The total intralayer capacitance of a multilayer wiring structure is equal to the capacitance of capacitive elements formed by multilayer wirings.

Figure 1A:
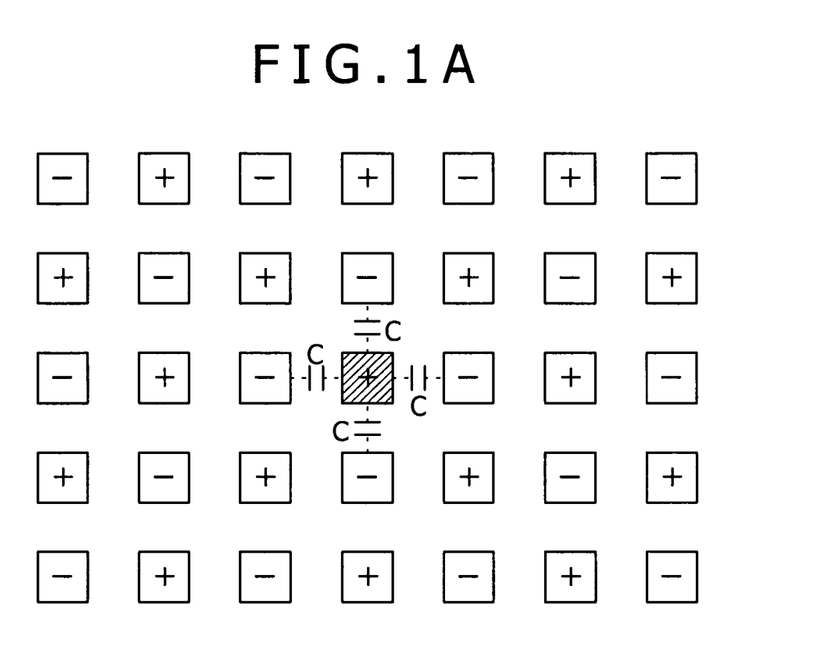
FIGS. 1A and 1B are sectional views illustrating a structural example of a capacitive element to which the present embodiment is applied.

A comb-shaped capacitive element made up of a combination of comb-shaped electrodes (refer, for example, to Patent Documents 1 and 2) is known as a capacitive element formed by multilayer wirings. In the case of this comb-shaped capacitive element, when we focus attention on a given electrode on a given section, the electrode of interest (shaded area) forms a capacitance C with each of the four electrodes, one on top, one on bottom, one to the right and one to the left, as illustrated in FIG. 1A if there is a potential difference between each paired electrodes.

Figure 1B:
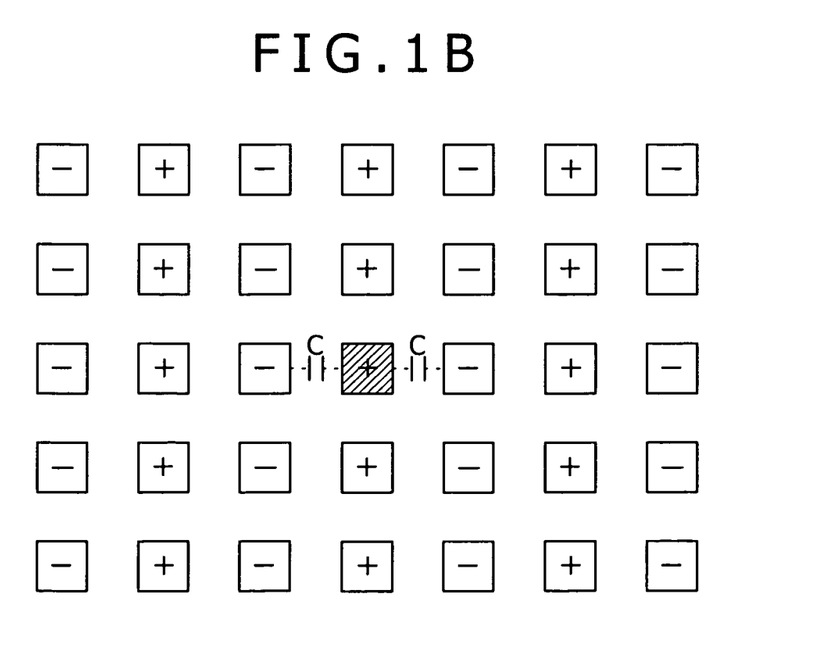

In addition to the above, in the case of a comb-shaped capacitive element, the electrode of interest forms the capacitance C with each of the two electrodes, one to the right and one to the left, as illustrated in FIG. 1B if there is a potential difference between each paired electrodes. In this case, the electrode of interest forms a capacitance with each of the four electrodes diagonally arranged with respect to the electrode of interest. The capacitance formed is extremely smaller than that formed between the electrode of interest and either of the two electrodes located to the left and right.

Figure 2:
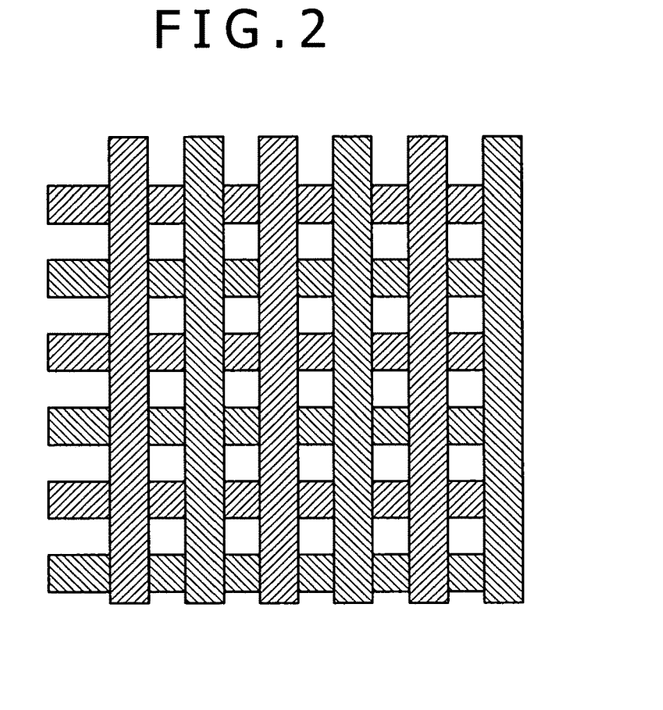
FIG. 2 is a plan view illustrating a structural example of the capacitive element to which the present embodiment is applied.

In addition to the comb-shaped capacitive element, other type of capacitive element is known as a capacitive element formed by multilayer wirings in which a plurality of parallel electrodes are laminated in such a manner as to intersect each other at right angles (refer, for example, to Japanese Patent Laid-Open No. 2000-252428) as illustrated in FIG. 2. In the case of this capacitive element, a capacitance is also formed between the electrode of interest and another electrode vertically, horizontally or, in some cases, diagonally adjacent to each other in the presence of a potential difference therebetween.

As is clear from the above description, the capacitive element to which the present embodiment is applied has a device structure containing one or more periods of linear wiring running in one direction and wiring-to-wiring spacing in each of the multilayer wirings. Further, the linear wirings and wiring-to-wiring spacings in different layers are parallel in such a manner as to partially or entirely overlap each other. Alternatively, the linear wirings and wiring-to-wiring spacings in different layers are partially or entirely perpendicular to each other.

As described above, the present embodiment relates to a capacitive element formed by multilayer wirings in an integrated circuit and is characterized in a designing method of the physical layout of a semiconductor circuit containing capacitive elements whose device structure provides reduced capacitance variation (designing method of a capacitive element). A specific description will be given below of the embodiments of the designing method.

<2. First Embodiment>

Figure 3:
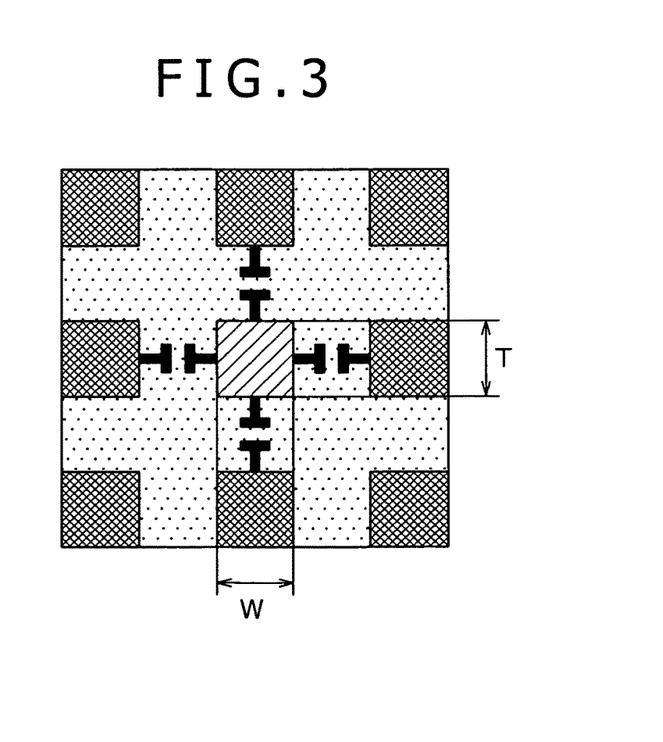
FIG. 3 is a sectional view illustrating the wiring structure of the capacitive element according to a first embodiment in which the relationship is shown between a wiring width W and a wiring height T.

A description will be given first of the designing method of a capacitive element according to a first embodiment. FIG. 3 illustrates a sectional view of the wiring structure of a typical device (capacitive element). In FIG. 3, the shaded area at the center is a wiring of interest (hereinafter written as the target wiring).

In the present embodiment, the capacitance (capacitance per unit sectional area) is calculated first by changing the wiring width and film thickness (wiring height) of the close-packed structure within the range of practical process variations. That is, the wiring width W and wiring height (film thickness) T are used as parameters to design a capacitive element.

Figure 4:
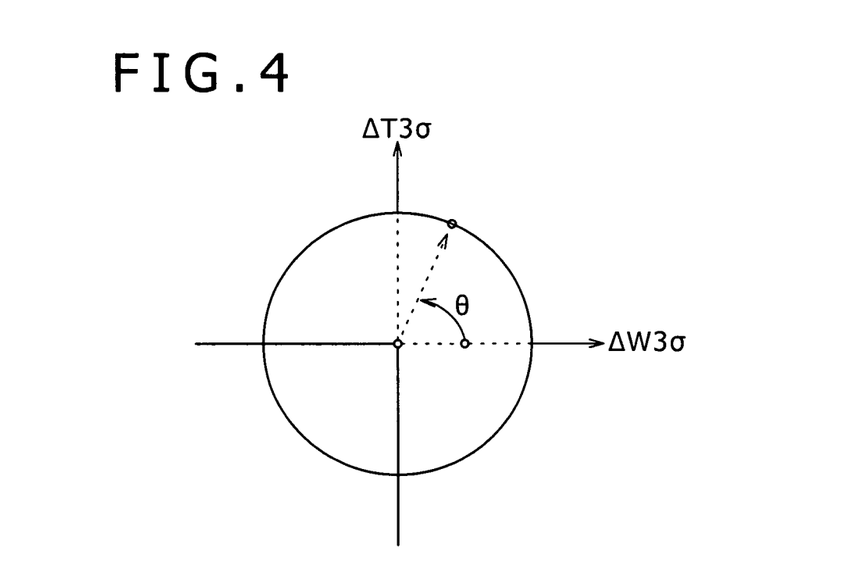
FIG. 4 is a diagram illustrating a unit circle adapted to find parameters by geometric probability.

Statistical process such as geometric probability approach as shown in FIG. 4 is used to change the wiring width W and film thickness T. A geometric probability approach is used, for example, for capacitance extraction (refer, for example, to document—K. Yamada and N. Oda, "Statistical Corner Conditions of Interconnect Delay (Corner LPE Specifications)," ICCAD' 06 proceedings of the 2006 IEEE, P706).

In FIG. 4, the vertical axis represents the wiring film thickness (height) T, and the horizontal axis the wiring width W. The radius of the circle is 1. That is, this circle is a unit circle. In this unit circle, all the combinations of the wiring width W and film thickness T projected from the point on the circumference of the circle at an angle θ are equally probable if the wiring width and film thickness are independent of each other. At an angle of 30 degrees of the circle, for example, the value on the X axis (i.e., wiring width) is W3σ×cos 30°, and the value on the Y axis (i.e., wiring film thickness) is T3σ×sin 30°.

The probability for the combination of parameters to be (W3σ×cos 30°, T3σ×sin 30°) is, for example, equal to that for the combination of parameters to be (W3σ×cos 60°, T3σ×sin 60°) at an angle of 60 degrees of the circle. Here, W3σ and T3σ represent 3 σ values (σ is a standard deviation) of process variations. There is only a small probability for both of the parameters to take on the maximum values (W3σ, T3σ) of the variation range. Therefore, using geometric probability eliminates such an unrealistic combination, making it possible to find combinations of parameters likely to occur.

Figure 5:
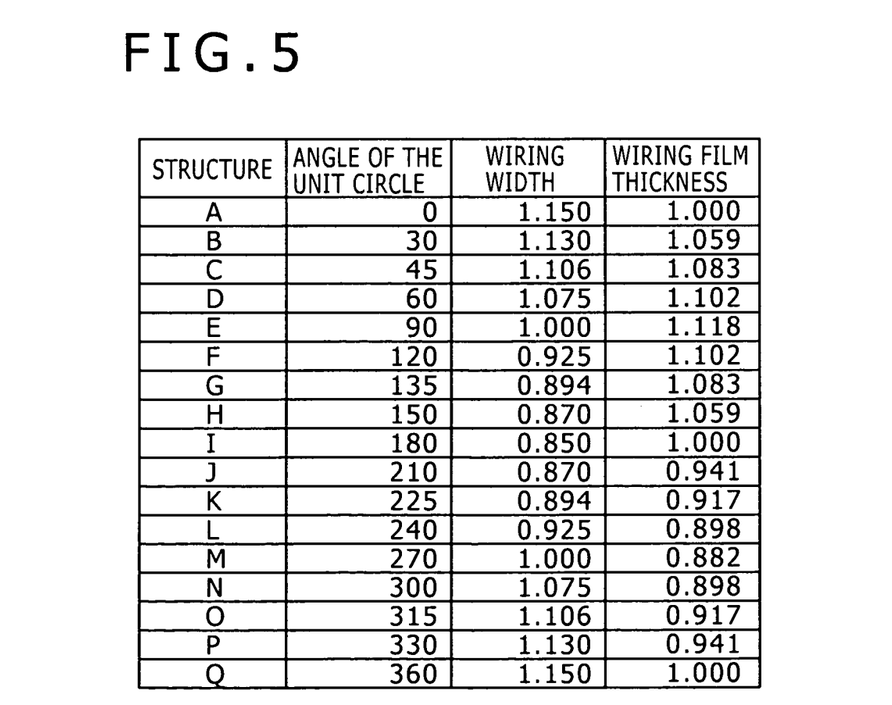
FIG. 5 is a diagram illustrating parameters for each angle found by geometric probability from the unit circle.
Figure 6:
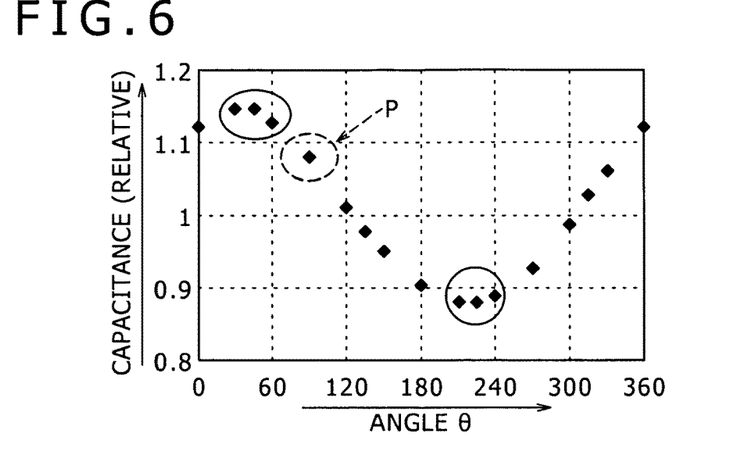
FIG. 6 is a diagram illustrating the relationship between the angles of the unit circle and the capacitances obtained by using the parameters determined by the angles.

FIG. 5 illustrates the calculated parameters (wiring width and height) of the target wiring for different angles in normalized values (relative values). FIG. 6 is a graph showing a normalized capacitance calculated for each structure obtained by substituting the parameters shown in FIG. 5 and combining the maximum and minimum values of the variations in thickness of the metal (wiring) on top or bottom other than the target wiring and the interlayer insulating film. In FIG. 6, the vertical axis represents the relative capacitance, and the horizontal axis the angle θ.

In the unit circle shown in FIG. 4, the wiring width W and height T change with change in angle θ. As a result, the capacitance (relative value) shows a gently sloping curve of a trigonometric function as illustrated in FIG. 6. It is clear therefrom that the capacitance takes on the maximum and minimum values when the wiring width and height are at given levels. What is noteworthy here is that the change in capacitance with change in device structure (θ) is small near the maximum and minimum values (small rate of change), maintaining the capacitance stable in these regions.

In the present embodiment, attention is focused on the small change in capacitance (small rate of change in capacitance). That is, when there is a large spacing as a result of the change in wiring width, there is a small change in intralayer capacitance with change in wiring width, thus making the interlayer capacitance predominant. In this region, therefore, the total capacitance remains unchanged irrespective of the change in wiring width. This is the reason why the capacitance is stable.

The maximum and minimum values of the parameters are combined for the wirings other than the target wiring in the capacitance calculation based on the graph shown in FIG. 6 in consideration of the sensitivity to capacitance (large rate of change in capacitance: high sensitivity, small rate of change in capacitance: low sensitivity). That is, it has been discovered as a result of the sensitivity study that, in the case of the device treated in the present specification, the width and height (thickness) of the target wiring are effective for the change in capacitance. Therefore, the device structure is prepared by combining the maximum and minimum film thickness values of the process variations for the parameters other than those to be changed.

The graph in FIG. 6 illustrates the change in total capacitance between metals (wirings) of the device. This graph changes depending on the process. Incidentally, the capacitance of the device having a close-packed structure (W:S=1:1) and a T:S ratio of 1.9:1 manufactured using a process similar to that used in the present embodiment corresponds to an area P enclosed by a dashed line circle in FIG. 6. As is clear from the graph in FIG. 6, the area P has a large rate of change with respect to the capacitance.

The electrostatic capacitance C of a plate capacitor model is generally given by the following equation:

$$C = \varepsilon \cdot S/d$$

where ε is the dielectric constant, S the area of the parallel plates, and d the distance between the parallel plates.

For this reason, where the metal capacitance is large, the capacitance of the device structure is increased by thinning the interlayer film (reducing the distance d). In contrast, where the metal capacitance is small, the capacitance of the device structure is reduced by thickening the interlayer film. That is, a large metal capacitance of the device structure is combined with the minimum interlayer film thickness, and a small metal capacitance thereof with the maximum interlayer film thickness. When the capacitance is not maximum or minimum, the interlayer film thickness is determined with the total film thickness maintained constant.

Figure 7:
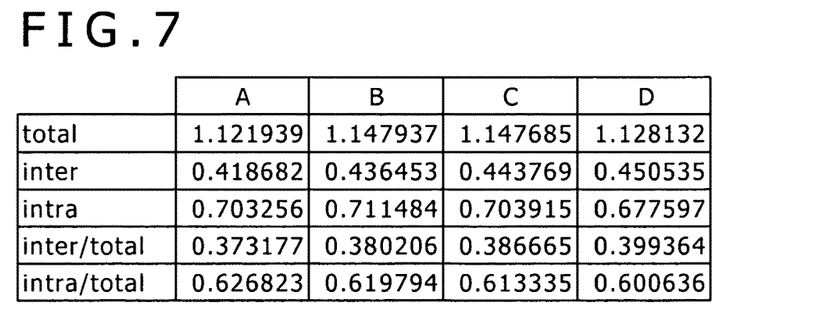
FIG. 7 is a table in which a capacitance is divided into a total capacitance, intralayer capacitance and interlayer capacitance which are shown in relative values.

FIG. 7 illustrates the capacitance divided into a total capacitance, intralayer capacitance and interlayer capacitance and represented in relative values. In FIG. 7, "total" represents the total capacitance of the device, "inter" the interlayer capacitance, i.e., the capacitance between the target wiring and wiring on top or bottom, and "intra" the intralayer capacitance, i.e., the capacitance between the target wiring and wiring to the left or right (wiring in the same layer).

Letters "A" to "D" in FIG. 7 correspond to structures A to D shown in FIG. 5. FIG. 5 illustrates the parameters, i.e., wiring width and height (film thickness), for different angles of the unit circle shown in FIG. 4, in relative values with respect to the close-packed structure of the design rule of the device generation. That is, letters "A" to "D" represent the device structures determined by the combinations of two parameters, namely, wiring width and height, for different angles of the unit circle.

It is clear from the table of FIG. 7 that, in the region where the total capacitance is stable with a small difference (structures B and C in FIG. 6), the differences between "ratio of the intralayer capacitance to the total capacitance" and "ratio of the interlayer capacitance to the total capacitance" (differences in the fourth and fifth rows in the columns "B" and "C" of the table in FIG. 7) are small. As a result, it is clear that a device structure is robust to process variations if the structure satisfies a specification, determined in advance, for the change in total capacitance between device structures (Y axis in FIG. 7) and if the above difference of the structure is smaller than a predetermined threshold.

In the present embodiment, the specification for the change in total capacitance is equal to or less than a given level such as 0.1% or less. By setting this condition, it is possible to extract the device structures B and C with a difference of 0.1% or less in total capacitance between device structures from among a plurality of device structures (structures A to Q in FIG. 5). These structures are obtained by changing the parameters of the target wiring, i.e., wiring width and height (film thickness), by a statistical process.

Next, the device structure whose difference between the "ratio of the intralayer capacitance to the total capacitance" and the "ratio of the interlayer capacitance to the total capacitance" is less than 0.01% is identified from among the plurality of device structures. In the case of the present embodiment, the device structure identified to be robust to process variations (after normalization) has a wiring width of 1.106 and a wiring film thickness of 1.083 at an angle of 45 degrees of the unit circle from FIG. 5.

In the present embodiment, a device structure whose difference between the "ratio of the intralayer capacitance to the total capacitance" and the "ratio of the interlayer capacitance to the total capacitance" satisfies a given condition is identified from among the device structures with a difference of 0.1% or less in total capacitance. However, the present embodiment is not limited thereto.

More specifically, a device structure both or either of whose "ratio of the intralayer capacitance to the total capacitance" and "ratio of the interlayer capacitance to the total capacitance," i.e., at least either of whose two ratios satisfies a given condition may be identified as a robust device structure.

The combination of parameters shown in the present embodiment, namely, wiring width and wiring film thickness of the target wiring, are not limited to these two, but various other parameters may be set by finding the sensitivity to capacitance (large rate of change in capacitance: high sensitivity, small rate of change in capacitance: low sensitivity).

Finally, by applying the wiring of the device structure identified by the designing method according to the present embodiment to all the layers from the lower to upper layers, it is possible to determine the optimal structure of the device having a multilayer structure (optimal device structure).

In the presence of a plurality of device structures having a process variation smaller than the predetermined threshold, on the other hand, a single device structure may be found by averaging the parameters of the plurality of device structures. Further, a device structure having the smallest process variation, i.e., difference between the "ratio of the intralayer capacitance to the total capacitance" and the "ratio of the interlayer capacitance to the total capacitance," may be identified from among a plurality of device structures as in the present embodiment.

Still further, the range of device structures satisfying the condition may be specified. For example, because the structure satisfying the condition of the present embodiment has 30 to 45 degrees as an angle of the unit circle in FIG. 6, the device structure is robust to process variations if the wiring width is 1.106 to 1.13 and the wiring film thickness 1.059 to 1.083.

On the other hand, the designing method according to the present embodiment intentionally varies the wiring width and film thickness. However, the optimal device structure may be determined by factoring in the variation in wiring film thickness which takes into consideration the microloading effect on the changed wiring width. Here, the term "microloading effect" refers to the change in film thickness with change in pattern (wiring) width as illustrated in FIG. 8.

Figure 8:
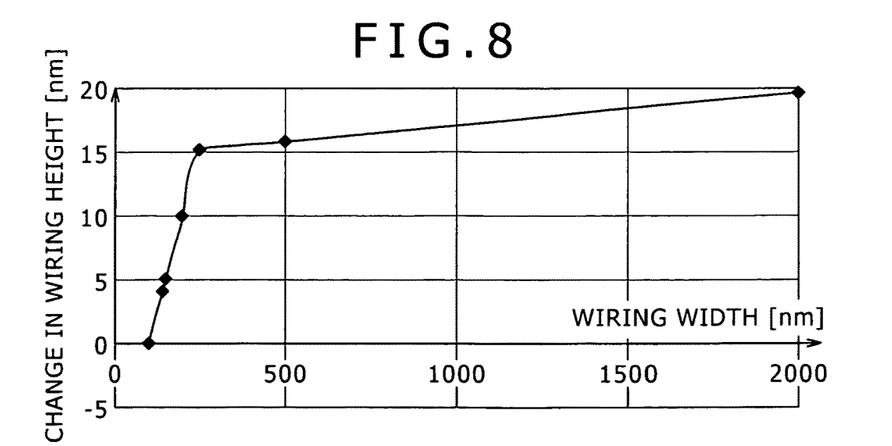
FIG. 8 is a diagram describing microloading effect (film thickness variation caused by wiring width)

In the example shown in FIG. 8, the film thickness changes to a large extent until a given wiring width is reached, but changes gently thereafter. The film thickness more correctly reflecting the process variation can be found by considering this change in film thickness.

More specifically, if the relationship of microloading effect is already obtained for the actual film thickness, a more accurate capacitance can be expressed by adding the change to each of the wiring widths. In the present embodiment, a microloading level is found by substituting the wiring width into the horizontal axis of FIG. 8. Then, the microloading level is added to the wiring film thickness.

In the present embodiment, we assume that the wirings on top and bottom and to the left and right of the target wiring (shaded area in FIG. 3) are at different potentials from that of the target wiring. In the present embodiment, the wiring on top and bottom of the target wiring are located perpendicular to the target wiring. However, the present embodiment is not limited to this structure, but the wirings on top and bottom of the target wiring may be located parallel to the target wiring.

Further, in the present embodiment, device structures were prepared by changing the wiring width and wiring film thickness within the range of practical process variations with the close-packed pitch used as a basis. For example, if the chip area is fixed in advance, if a structure having a pitch resistant to existing process variations is already fixed, or if the demanded capacitance and other demands are fixed in advance, it is difficult to switch over to a structure having a close-packed pitch.

In such a case, the method according to the present embodiment is applicable not only to a close-packed structure having a one-to-one relationship between the wiring width and wiring-to-wiring spacing but also to a structure having anything other than a one-to-one relationship therebetween due to other restriction. In other words, it is possible to adopt a pitch resistant to process variations other than a close-packed pitch and apply the method according to the present embodiment to this pitch so as to determine a robust device structure.

As described above, if a structure has, for example, a difference of 0.1% or less in total capacitance between device structures and a difference of less than 0.01% between the ratio of the intralayer capacitance to the total capacitance and the ratio of the interlayer capacitance to the total capacitance, the following advantageous effect can be achieved. That is, such a structure provides reduced capacitance variation as compared to a device structure having a one-to-one relationship between the wiring width and wiring-to-wiring spacing (close-packed structure).

Providing reduced capacitance variation is equivalent to lessening the slope of the Peligrom plot shown in the graph of FIG. 16, making it possible to reduce the capacitive element area in proportion to the square of the slope. That is, the area of the capacitive element can be reduced by reducing the capacitance variation of the capacitive element.

<3. Second Embodiment>

Figure 9:
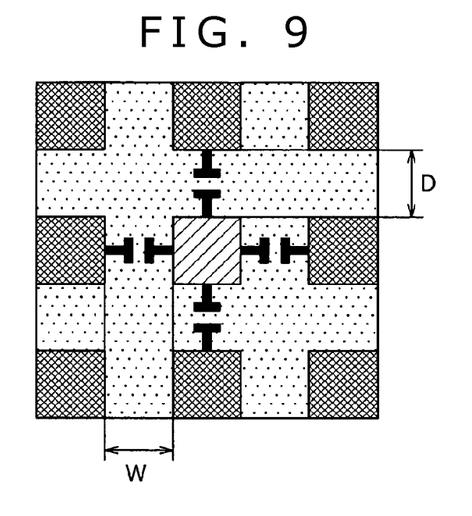
FIG. 9 is a sectional view illustrating the wiring structure of the capacitive element according to a second embodiment in which the relationship is shown between a wiring-to-wiring spacing S and a distance D to the wiring on top or bottom is shown.

In the first embodiment, the wiring width W and wiring height (film thickness) T are used as parameters to design a capacitive element. In contrast, in the present embodiment, the spacing S between the target wiring (shaded area) and the wiring to the left or right in the same layer and the distance D between the target wiring and wiring on top or bottom (interlayer film thickness) in the wiring structure of a typical device (capacitive element) shown in FIG. 9 are used as parameters to design a capacitive element.

More specifically, in the present embodiment, the relationship between the capacitance and angle shown in FIG. 6 is found first by varying the parameters in the same manner as in the first embodiment. Next, a stabilizing structure is found by changing the threshold setting from that in the first embodiment. The threshold setting refers to the setting relating to the ratio D/S between the distance D to the wiring on top or bottom to the spacing S between the wirings forming the capacitive element shown in FIG. 9. That is, the difference between the ratio D/S and the ratio Dmin/Smin for the close-packed structure of the design rule of the target generation is set as the threshold.

The wiring-to-wiring spacing S and the distance D to the wiring on top or bottom are parameters adapted to consider the ratio of the interlayer capacitance to the total capacitance and the ratio of the intralayer capacitance to the total capacitance, assuming that the total wiring capacitance is the sum of the intralayer capacitance and interlayer capacitance. The smaller the wiring-to-wiring spacing S, the larger the intralayer capacitance. On the other hand, the smaller the distance D from the target wiring to the wiring on top or bottom, the larger the interlayer capacitance.

Therefore, the total capacitance reaches its maximum when both the target wiring width W and film thickness T increase (when both S and D decrease). In contrast, the total capacitance reaches its minimum when both the target wiring width W and film thickness T decrease (when both S and D increase). FIG. 6 illustrates a curve showing the change in capacitance between its maximum and minimum values with the change in the wiring film thickness T and wiring width W.

In the present embodiment, a device structure is optimal when the absolute value of the difference between two ratios, namely, the ratio of the distance D from the target wiring to the wiring on top or bottom to the wiring-to-wiring spacing S and the ratio Dmin/Smin in the case of a close-packed structure, is greater than 0 and less than 0.1. The table in FIG. 10A shows, in the fourth row, the differences $\Delta Di/Si = Di/Si - Dmin/Smin$ for the four structures A to D with the different wiring-to-wiring spacings S and distances D.

Figure 10A:
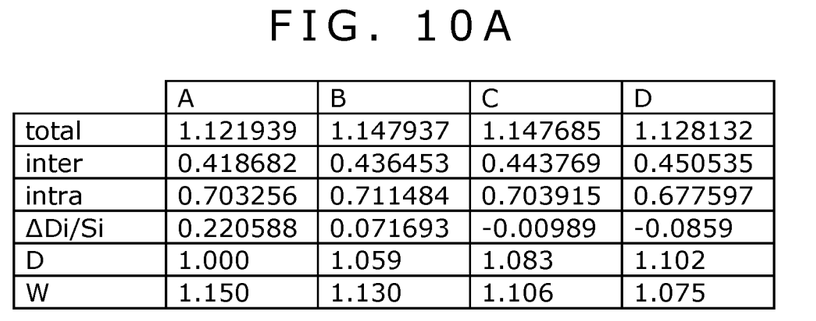
FIGS. 10A and 10B are diagrams illustrating the relationship between the capacitance, wiring width and wiring film thickness of the capacitive element according to the second embodiment.

$\Delta Di/Si$ in the fourth row of the table in FIG. 10A shows that the absolute value of the difference is greater than 0 and less than 0.1 for structures B, C and D. Of these structures, structure C has the smallest difference. Therefore, this structure is considered the optimal choice for immunity (most resistant) to process variations on the high capacitance side.

Figure 10B:
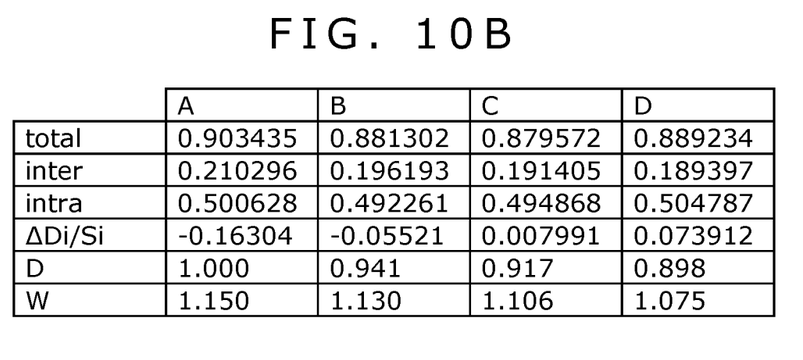

On the other hand, a stable point on the low capacitance side may be considered in the same manner. The table in FIG. 10B shows, in the fourth row, the differences between the ratios on the low capacitance side. Structures E to H represent four structures with the different wiring-to-wiring spacings S and distances D. Based on the differences, structure G is judged to be the optimal choice for immunity to process variations. Further, combining the results on the high and low capacitance sides together, structure G is the optimal device structure with the smallest process variation.

However, there are a plurality of device structures satisfying the specification of the present embodiment, i.e., difference in D/S ratio of greater than 0 and less than 0.1. From FIGS. 10A and 10B, structures B, C, D, F, G and H satisfy the specification of the present embodiment, i.e., difference in D/S ratio of greater than 0 and less than 0.1.

Therefore, average values of the distance D to the wiring on top or bottom and wiring-to-wiring spacing S may be found for each of the two sets of structures, one set of structures B, C and D on the high capacitance side and another set of structures F, G and H on the low capacitance side. Alternatively, an average structure and the ranges of the distance D to the wiring on top or bottom and the wiring-to-wiring spacing S (ranges for structures B, C and D or F, G and H in the present embodiment) may be indicated.

In the present embodiment, the ratio between the wiring-to-wiring spacing S and the distance D to the wiring on top or bottom is compared against that for the close-packed structure. However, the structure to be compared with is not limited to the close-packed structure. Instead, various other structures may be set as a reference for comparison according to the process and layout, including the device structures described in the first embodiment. Then, the optimal structure can be determined by varying the distance D and wiring-to-wiring spacing S of the structure used as a reference for comparison. Further, the threshold of 0.1 may also be changed to various other values.

Finally, by applying the wiring of the device structure identified by the designing method according to the present embodiment to all the layers from the lower to upper layers, it is possible to determine the optimal structure of the device having a multilayer structure (optimal device structure).

As described above, a structure provides reduced capacitance variation as compared to the close-packed structure if the difference in total capacitance between device structures is 0.1% or less and if the difference between the ratio D/S and ratio Dmin/Smin is greater than 0 and less than 0.1.

Providing reduced capacitance variation is equivalent to lessening the slope of the Peligrom plot shown in the graph of FIG. 16, making it possible to reduce the capacitive element area in proportion to the square of the slope. That is, the area of the capacitive element can be reduced by reducing the capacitance variation of the capacitive element.

<4. Third Embodiment>

In the present embodiment, the relationship between the capacitance and angle shown in FIG. 6 is found first by varying the parameters in the same manner as in the first embodiment. Next, a stabilizing structure is found by changing the threshold setting from those in the first and second embodiments. The threshold set in the present embodiment is a derivative of the capacitance variation curve shown in FIG. 11.

Figure 11:
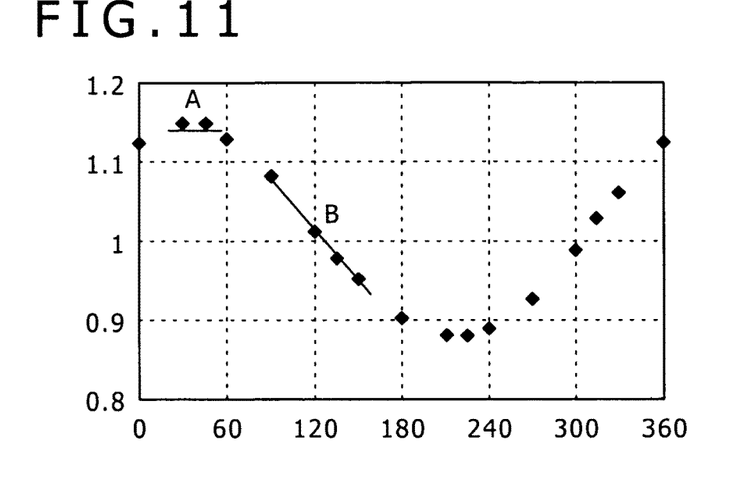
FIG. 11 is a diagram illustrating the relationship between a capacitance variation curve and its derivative.

That is, the capacitance variation curve shown in FIG. 11 is assumed to be a function having the wiring width W and film thickness T as variables. A device structure is considered robust to process variations if the structure satisfies $\delta C/\delta \theta = 0$ when the wiring width W and film thickness T are represented by a variation factor $\theta$, that is, $C = F(W(\theta), T(\theta),$ constant).

This condition corresponds to the area denoted by letter A in FIG. 11. There are a plurality of device structures (two in this example) falling in the area denoted by letter A. In this case, either of the two structures may be selected as the optimal device structure. Alternatively, the optimal device structure may be selected by averaging the parameters of the plurality of device structures. Still alternatively, the optimal device structure may be defined based on an average structure and parameter ranges. On the other hand, the existing method uses device structures in the area corresponding to the slope denoted by letter B. As a result, it is obvious that these structures have a large variation in capacitance with change in the variation factor, making these structures susceptible to process variations.

Finally, by applying the wiring of the device structure identified by the designing method according to the present embodiment to all the layers from the lower to upper layers, it is possible to determine the optimal structure of the device having a multilayer structure (optimal device structure).

As described above, a structure provides reduced capacitance variation as compared to the close-packed structure if the difference in total capacitance between device structures is 0.1% or less and if the structure satisfies δC/δθ=0 when the wiring width W and film thickness T are represented by the variation factor θ.

Providing reduced capacitance variation is equivalent to lessening the slope of the Peligrom plot shown in the graph of FIG. 16, making it possible to reduce the capacitive element area in proportion to the square of the slope. That is, the area of the capacitive element can be reduced by reducing the capacitance variation of the capacitive element.

In the present embodiment, the wiring width W and film thickness T of the capacitance variation curve are set as parameters. However, the parameters are not limited to the wiring width W and film thickness T, but instead various other parameters with high sensitivity to the capacitance variation may be set according to the device structure, process conditions and layout.

<5. Fourth Embodiment>

In the present embodiment, a stabilizing structure is found by changing the threshold setting from that in the third embodiment. That is, the capacitance variation curve is assumed to be a function having the wiring width W and film thickness T in the multilayer wirings according to the third embodiment as variables. A device structure is robust to process variations if the structure satisfies the condition δC/δθ<0.01 where δC/δθ is the rate of change of the function when the wiring width W and wiring height T are represented by the variation factor θ, i.e., C=F (W(θ), T(θ), constant).

Figure 13:
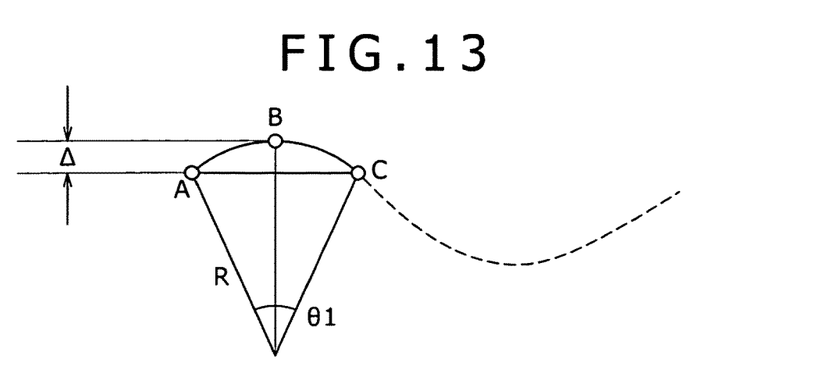
FIG. 13 is a diagram illustrating the relationship between the capacitance variation curve, its radius of curvature and center angle.

The curve shown in FIG. 13 illustrates part of a capacitance variation curve. Letting the curvature radius of an arc made up of arbitrary points A, B and C on the curve, i.e., an arbitrary arc subsumed in C=F (W(θ), T(θ), constant), be denoted by R, and the center angle for the arc by θ1, a rate of change of capacitance Δ can be expressed by the following equation:

$$\Delta = R(1-\cos(\theta 1/2))$$

As a result, the above condition is expressed by the equation R $(1-\cos(\theta 1/2))<0.01$. Here, the curvature radius R is the reciprocal of the curvature and can be found, for example, by second order derivative of a given function at an arbitrary point.

Figure 12:
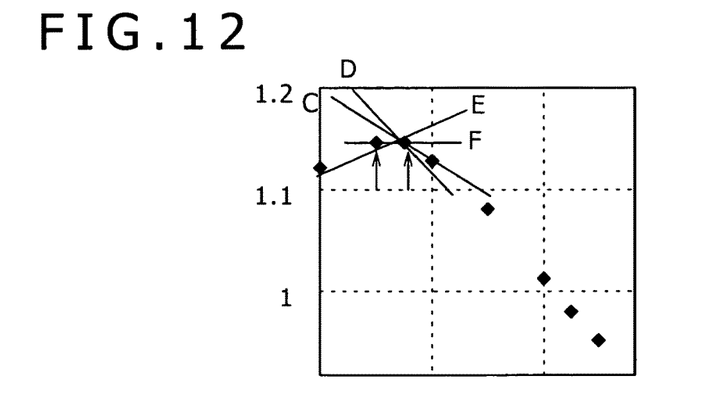
FIG. 12 is a diagram illustrating the relationship between the capacitance variation curve and its curvature.

The slopes of various functions shown to the left of the variation curve in FIG. 12 represent the derivatives of structures. FIG. 12 shows slopes C to F as examples. Of these slopes, only the slope F satisfies the above condition. In the present embodiment, therefore, the structures satisfying the slope F (two points indicated by arrows in the graph) are considered to be candidates for the optimal device structure.

Then, the device structure obtained by averaging the wiring widths and film thicknesses of the two structures or candidates is used as the optimal structure. As described above, if there are a plurality of device structures satisfying the condition in the selection of the optimal structure, the structure having the smallest derivative may be selected as the optimal device structure. Alternatively, the structure obtained by averaging the parameters of the structures satisfying the condition may be selected as the optimal structure.

In the present embodiment, the wiring width and film thickness of the capacitance variation curve are set as parameters. However, the parameters are not limited to the wiring width and film thickness, but instead various other parameters with high sensitivity to the capacitance variation may be set according to the device structure and process conditions. Further, the range is not limited to less than 0.01, but various other ranges may be set according to the device structure, process conditions and layout.

Finally, by applying the wiring of the device structure identified by the designing method according to the present embodiment to all the layers from the lower to upper layers, it is possible to determine the optimal structure of the device having a multilayer structure (optimal device structure).

As described above, a capacitive element having a device structure falling in the area denoted by letter A in FIG. 11 provides reduction in capacitance variation to one tenth or more over that having a device structure falling in the area denoted by letter B in FIG. 11. Providing reduced capacitance variation is equivalent to lessening the slope of the Peligrom plot shown in the graph of FIG. 16, making it possible to reduce the capacitive element area in proportion to the square of the slope. That is, the area of the capacitive element can be reduced by reducing the capacitance variation of the capacitive element.

<6. Application Example>

A capacitive element manufactured according to any one of the designing methods according to the first to fourth embodiments, i.e., the pattern designing methods used to prepare the physical layout of the capacitive element, can be used as such in a semiconductor device (integrated circuit device) incorporating the capacitive elements. Then, a semiconductor device incorporating the capacitive elements is manufactured by using a mask with optical proximity correction. The mask has a physical layout prepared based on the present designing method. Optical proximity correction is a mask correction technique used during semiconductor manufacture.

Figure 14:
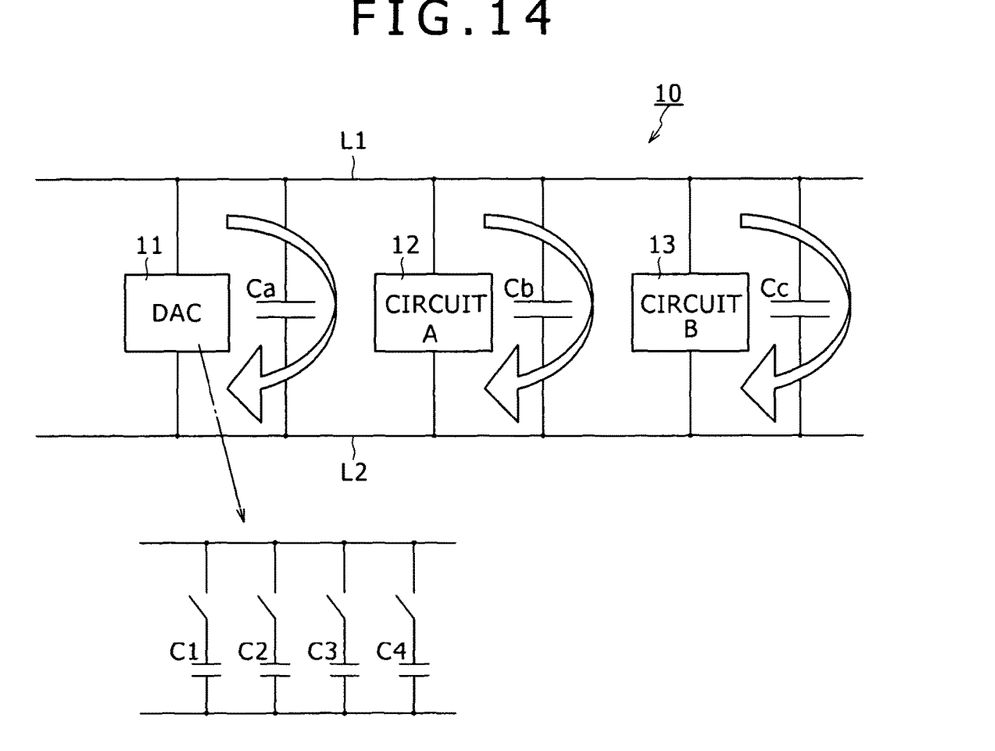
FIG. 14 is a conceptual diagram of a circuit containing the capacitive elements according to the present embodiment and decoupling cells.

An example of semiconductor device incorporating the capacitive elements is a circuit device 10 as shown in FIG. 14. The same device 10 contains a DA converter (DAC) 11 and other circuits (A and B) 12 and 13. The DA converter 11 is a capacitance-type DA converter and includes a plurality of capacitive elements C1 to C4 connected in parallel.

In the capacitance-type DA converter 11, it is the most important to keep the process variations of the capacitive elements C1 to C4 to a minimum in terms of DA conversion accuracy. Therefore, the most essential factor in the DA converter 11 is to use capacitive elements robust to process variations, designed based on any one of the methods according to the first to fourth embodiments, as the plurality of capacitive elements C1 to C4 connected in parallel.

In the circuit device 10, on the other hand, decoupling cells Ca, Cb and Cc are connected between power lines L1 and L2 to reduce supply voltage noise and fluctuation. The decoupling cells Ca, Cb and Cc are inserted between the DA converter 11 and the circuits (A and B) 12 and 13 to isolate these circuits from each other. Thus, external noise is shut off by providing smaller circuit loops.

A capacitive element having a close-packed structure with a one-to-one relationship between the wiring width W and wiring-to-wiring spacing S is, for example, used as the decoupling cells Ca, Cb and Cc. The reason for this is that importance is attached to the area efficiency rather than the capacitance variation for the decoupling cells Ca, Cb and Cc. That is, it is essential that higher capacitance should be obtained for the same area.

As described above, capacitive elements designed to be robust to process variations by one of the methods according to the first to fourth embodiments are mixed with other capacitive elements such as those having a close-packed structure in the circuit device 10 and other circuitry. That is, capacitive elements robust to process variations and other capacitive elements such as those having a close-packed structure are used selectively according to the application. Thus, changing the structure and area of the capacitive elements according to intended purpose provides reduced chip area as a whole and reduced power consumption.

The capacitive elements have been designed with a pitch 1.5 times to twice the minimum pitch in the design rule of each generation to provide resistance to process variations. The designing methods according to the first to fourth embodiments allow to find a structure robust to process variations based on the smallest pitch, thus providing 50% reduction in area as a whole of the circuit device such as DA converter as compared to the existing art. This 50% reduction is achieved by a synergetic effect combining the area reduction effect as a result of reduced process variations and the design based on the minimum pitch.

Further, reduced capacitance variation contributes to linearity of the capacitive elements connected in parallel as in the case of a DA converter, thus providing intended performance with a small area. Still further, a device incorporating capacitive elements designed by one of the methods according to the first to fourth embodiments and other capacitive elements provides intended performance and offers reduced area as a whole at the same time when capacitive elements fit for intended purpose are used.

The present application contains subject matter related to that disclosed in Japanese Priority Patent Application JP 2009-032245 filed in the Japan Patent Office on Feb. 16, 2009, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A capacitive element, comprising:
a first layer of wirings, wherein an intralayer capacitance exists between a target wiring in the first layer of wirings and a first wiring in the first layer of wirings; and
a second layer of wirings adjacent to the first layer of wirings, wherein an interlayer capacitance exists between the target wiring in the first layer of wirings and a first wiring in the second layer of wirings,
wherein an interlayer ratio is a ratio of the interlayer capacitance to a total capacitance,
wherein an intralayer ratio is a ratio of the intralayer capacitance to the total capacitance,
wherein the total capacitance is a sum of the intralayer capacitance and the interlayer capacitance,
wherein a difference between the intralayer ratio and the interlayer ratio is less than 0.01% of the total capacitance, wherein the difference corresponds to $R(1-\cos(\theta/2))$, wherein R represents a curvature radius of a total capacitance variation curve of the total capacitance and $\theta$ represents a center angle of the total capacitance variation curve,
wherein the first layer of wirings is perpendicular to the second layer of wirings, and
wherein at least a portion of the first layer of wirings overlaps with at least a portion of the second layer of wirings.

2. A capacitive element, comprising:
a device structure that includes interlayer insulating film between a first layer of wirings and a second layer of wirings,
wherein a total capacitance of the device structure is a sum of an intralayer capacitance and an interlayer capacitance,
wherein the intralayer capacitance exists between a target wiring in the first layer of wirings and a first wiring in the first layer of wirings,
wherein the interlayer capacitance exists between a first wiring in the second layer of wirings and the target wiring in the first layer of wirings,
wherein the first layer of wirings is perpendicular to the second layer of wirings,
wherein at least a portion of the first layer of wirings overlaps with at least a portion of the second layer of wirings,
wherein a difference between an intralayer ratio and an interlayer ratio is less than 0.01% of the total capacitance of the device structure, wherein the difference corresponds to $R(1-\cos(\theta/2))$, wherein R represents a curvature radius of a total capacitance variation curve of the total capacitance and $\theta$ represents a center angle of the total capacitance variation curve,
wherein the intralayer ratio is a ratio of the intralayer capacitance to the total capacitance of the device structure, and
wherein the interlayer ratio is a ratio of the interlayer capacitance to the total capacitance of the device structure.

3. A capacitive element, comprising:
a target wiring between a first wiring and a third wiring, the target wiring is between a second wiring and a fourth wiring;
a first portion of an interlayer insulating film between the first wiring and the target wiring, wherein an intralayer capacitance exists between the first wiring and the target wiring; and
a second portion of the interlayer insulating film between the second wiring and the target wiring, wherein an interlayer capacitance exists between the second wiring and the target wiring,
wherein a difference between an intralayer ratio and an interlayer ratio is a determined percent or less of a total capacitance, wherein the difference corresponds to $R(1-\cos(\theta/2))$, wherein R represents a curvature radius of a total capacitance variation curve of the total capacitance and $\theta$ represents a center angle of the total capacitance variation curve,
wherein the total capacitance is a sum of the intralayer capacitance and the interlayer capacitance,
wherein the intralayer ratio is a ratio of the intralayer capacitance to the total capacitance,
wherein the interlayer ratio is a ratio of the interlayer capacitance to the total capacitance,
wherein the first wiring is perpendicular to the second wiring, and
wherein at least a portion of the first wiring overlaps with at least a portion of the second wiring.

4. The capacitive element of claim 3, wherein the determined percent is 0.01%.

5. The capacitive element of claim 3, wherein a potential at the target wiring is different from a potential at the first wiring, and a potential at the second wiring is different from the potential at the target wiring.

6. The capacitive element of claim 3, wherein the first portion of the interlayer insulating film touches the first wiring and the target wiring.

7. The capacitive element of claim 3, wherein the second portion of the interlayer insulating film touches the second wiring and the target wiring.

8. The capacitive element of claim 3, wherein the target wiring is between the first portion of the interlayer insulating film and a third portion of the interlayer insulating film.

9. The capacitive element of claim 3, wherein the first wiring and the target wiring are in a first layer of wirings, the second wiring is in a second layer of wirings.

10. The capacitive element of claim 9, wherein the first wiring and the second wiring are metallic.

11. The capacitive element of claim 3, further comprising:
a third portion of the interlayer insulating film between the third wiring and the target wiring.

12. The capacitive element of claim 11, wherein the third portion of the interlayer insulating film touches the third wiring and the target wiring.

13. The capacitive element of claim 11, further comprising:
a fourth portion of the interlayer insulating film between the fourth wiring and the target wiring.

14. The capacitive element of claim 13, wherein the fourth portion of the interlayer insulating film touches the fourth wiring and the target wiring.

15. The capacitive element of claim 13, wherein the target wiring is between the second portion of the interlayer insulating film and the fourth portion of the interlayer insulating film.

16. The capacitive element of claim 11, wherein the first portion of the interlayer insulating film is separated from the third portion of the interlayer insulating film based on a width of the target wiring.

17. The capacitive element of claim 13, wherein the second portion of the interlayer insulating film is separated from the fourth portion of the interlayer insulating film based on a height of the target wiring.

\* \* \* \* \*